US009429600B2

(12) United States Patent
Hamouz et al.

(10) Patent No.: US 9,429,600 B2
(45) Date of Patent: Aug. 30, 2016

(54) APPLIANCE MONITORING AND CONTROL SYSTEMS

(76) Inventors: Miroslav Hamouz, Cambridge (GB); Pilgrim Giles William Beart, Cambridge (GB)

(*) Notice: Subject to any disclaimer, the term of this patent is extended or adjusted under 35 U.S.C. 154(b) by 759 days.

(21) Appl. No.: 13/642,293

(22) PCT Filed: Apr. 20, 2011

(86) PCT No.: PCT/GB2011/050783
§ 371 (c)(1),
(2), (4) Date: Mar. 6, 2013

(87) PCT Pub. No.: WO2011/131984
PCT Pub. Date: Oct. 27, 2011

(65) Prior Publication Data
US 2013/0204559 A1 Aug. 8, 2013

(30) Foreign Application Priority Data

Apr. 23, 2010 (GB) .................................. 1006817.9
May 26, 2010 (GB) .................................. 1008796.3

(51) Int. Cl.
G06F 19/00 (2011.01)
G01R 21/00 (2006.01)
(Continued)

(52) U.S. Cl.
CPC ............... *G01R 21/00* (2013.01); *G01D 4/002* (2013.01); *H02J 13/0006* (2013.01);
(Continued)

(58) Field of Classification Search
CPC .... A61B 5/681; A61B 5/1117; A61B 5/7267
USPC ..................................... 702/61, 64, 182–185
See application file for complete search history.

(56) References Cited

U.S. PATENT DOCUMENTS 4,858,141 A  8/1989 Hart et al.
5,483,153 A  1/1996 Leeb et al.
(Continued)

FOREIGN PATENT DOCUMENTS

DE  10 2007 051 347 A1  7/2009
EP  2012132  7/2008
(Continued)

OTHER PUBLICATIONS

Cole "Data Extraction for Effective Non-Intrusive Identification of Residenctial Power Loads" Instrumentation and Measurement Tech. Conf. May 18, 1998.
(Continued)

*Primary Examiner* — Edward Raymond
(74) *Attorney, Agent, or Firm* — Brouse McDowell; Michael G. Craig

(57) ABSTRACT

We describe a system to provide feedback to a user of an appliance for energy saving, the system comprising: means for monitoring an energy consumption of the appliance; means for inferring a mode of use of the appliance from said power consumption; and means for providing feedback to said user responsive to said inferred mode of use to indicate how an amount of energy used by said appliance may be reduced. In some embodiments the means for monitoring power consumption comprises means for identifying one or more periods of operation of the appliance from data representing aggregate power consumption of a plurality of devices including the appliance. In embodiments the means for monitoring the power consumption comprises means for monitoring mains electricity power consumption of the plurality of devices. Alternatively the means for monitoring the power consumption may comprise, for example, a plug-through power sensing device.

17 Claims, 6 Drawing Sheets

(51) Int. Cl.
    *G01D 4/00*     (2006.01)
    *H02J 13/00*     (2006.01)
    *G01R 21/133*     (2006.01)

(52) U.S. Cl.
    CPC ......... *G01R 21/133* (2013.01); *Y02B 70/3266* (2013.01); *Y02B 90/241* (2013.01); *Y02B 90/245* (2013.01); *Y04S 20/242* (2013.01); *Y04S 20/32* (2013.01); *Y04S 20/38* (2013.01); *Y04S 20/40* (2013.01)

(56) References Cited

U.S. PATENT DOCUMENTS

| | | | |
|---|---|---|---|
| 5,717,325 | A | 2/1998 | Leeb et al. |
| 6,906,617 | B1 | 6/2005 | Van der Meulen |
| 7,423,546 | B1 | 9/2008 | Aisa |
| 7,693,670 | B2 | 4/2010 | Durling et al. |
| 8,290,635 | B2 | 10/2012 | Cohen |
| 8,843,334 | B2 | 9/2014 | Donaldson et al. |
| 2006/0071666 | A1 | 4/2006 | Unsworth et al. |
| 2010/0030393 | A1 | 2/2010 | Masters et al. |
| 2010/0117625 | A1 | 5/2010 | Botts |
| 2010/0161502 | A1 | 6/2010 | Kumazawa et al. |
| 2010/0241284 | A1 | 9/2010 | Maeda et al. |
| 2011/0004421 | A1 | 1/2011 | Rosewell et al. |
| 2011/0251807 | A1* | 10/2011 | Rada ............. G01D 4/00 702/61 |

FOREIGN PATENT DOCUMENTS

| | | |
|---|---|---|
| EP | 2026299 A1 | 2/2009 |
| GB | 2461915 | 1/2010 |
| GB | 2475172 A | 5/2011 |
| JP | 2002311070 A | 10/2002 |
| JP | 2009047682 A | 3/2009 |
| JP | 2010087487 A | 4/2010 |
| WO | WO 01/15300 | 3/2001 |
| WO | WO 2009/066742 | 5/2009 |
| WO | WO 2009/109787 | 9/2009 |

OTHER PUBLICATIONS

Therrien et al "Signal Processor for a Power System Non-Intrusive Load Monitoing System" Florida State Univ. DigiNole Commons, Feb. 24, 2006.

Lima et al "Filtering Method in Backlash Phemonema Analysis" Mathematical and Computer Modelling 49, 2009, pp. 1494-1503, elsevier Ltd.

Santoso et al., "Characterization of distribution power quality events with fourier and wavelet transforms", IEEE Transactions on Power Delivery vol. 15, No. 1, Jan. 2000.

Hart, Non-Intrusive Appliance Loads Monitoring, Proceedings of the IEEE, vol. 80, No. 12, Dec. 1992, pp. 1870-1891.

Chan et al., "Harmonics load signature recognition by wavelets transforms", International Conf. on Electric Utility Deregulation and Restructuring and Power Tech. Apr. 2000.

Albano et al., "Voltage sag analysis on three phase systems using wavelets transform and probabilistic neural network", Univ. Power Eng. Conf. Sep. 8, 2004.

Vega et al., "Selecting wavelet functions for detection of power quality disturbances", IEEE 2008, pp. 1-4.

"Discrete Wavelet Transform" Wikipedia retrieved from: http://en.wikipedia.org/w/index.php?title=Discrete_wavelet_transform&oldid=651824074 page revised on Mar. 17, 2015.

L. Szabo, J.B. Dobai, K.A. Biro: "Discrete wavelet transform based rotor faults detection method for induction machines", Intelligent Systems at the Services of Mankind, vol. 2, Ubooks, Augsburg (Germany), 2005, pp. 63-74, ISBN: 3866080522.

* cited by examiner

APPLIANCE MONITORING AND CONTROL SYSTEMS

CROSS REFERENCE TO RELATED APPLICATION

The present application claims priority to Patent Application No. PCT/GB2011/050783 entitled "Appliance Monitoring and Control Systems", and filed Apr. 20, 2011; and claims priority to British Patent Application No. GB1008796.3 filed May 26, 2010, and British Patent Application No. GB1006817.9 filed Apr. 23, 2010. The entirety of each of the aforementioned references is incorporated herein by reference for all purposes.

BACKGROUND

Embodiments relate to systems, methods and computer program code for monitoring and providing feedback on the usage of domestic appliances.

A cost-effective option for monitoring the electrical power consumption of a domestic property is to provide the user with an aggregated power series of the total electrical power consumption of the property, for example at a low-sample rate (~1 Hz). From this aggregated power consumption data, the user can make informed choices of how to use electrical power within the property in order to improve efficiency. However whilst the user is presented with an overall total of the power consumption, the user has no visibility of the performance of individual electrical power consuming devices/appliances, for example washing machines, dishwashers, tumble driers, irons, ovens, kettles and the like. Background prior art relating to monitoring power-consuming devices can be found in U.S. Pat. No. 4,858,141, U.S. Pat. No. 5,483,153 and U.S. Pat. No. 5,717,325. U.S. Pat. No. 5,483,153, for example, detects the initial On and the final Off transient (using high-sample rate data when this is easier).

It is, however, advantageous to present consumers with information explaining where their domestic energy consumption is happening, for example the relative cost of running different appliances. This is because armed with this information they can then choose to change their behavior in order to reduce their consumption and thus save themselves money, for example by using costly-to-run appliances less often, or using them in a lower-cost manner when they are used.

We have therefore appreciated the need for improved energy monitoring and feedback techniques.

BRIEF SUMMARY

Embodiments relate to systems, methods and computer program code for monitoring and providing feedback on the usage of domestic appliances.

Some embodiments of the present invention provide a system to provide feedback to a user of an appliance for energy saving, the system comprising: means for monitoring an energy consumption of the appliance; means for inferring a mode of use of the appliance from said power consumption; and means for providing feedback to said user responsive to said inferred mode of use to indicate how an amount of energy used by said appliance may be reduced.

In some embodiments the means for monitoring power consumption comprises means for identifying one or more periods of operation of the appliance from data representing aggregate power consumption of a plurality of devices including the appliance. In embodiments the means for monitoring the power consumption comprises means for monitoring mains electricity power consumption of the plurality of devices. Alternatively the means for monitoring the power consumption may comprise, for example, a plug-through power sensing device.

In embodiments the inferred mode of use comprises an inferred amount of water boiled by the appliance and/or a temperature to which water is heated. Preferably the feedback comprises one or both of an estimated energy saving and an estimated cost saving by reducing one or both of an amount of water use and a temperature to which water is heated by the appliance.

In a related aspect the invention provides a method of providing feedback to a user of an appliance for energy saving, the method comprising: monitoring an energy consumption of the appliance; inferring a mode of use of the appliance from said power consumption; and providing feedback to said user responsive to said inferred mode of use to indicate how an amount of energy used by said appliance may be reduced.

Some embodiments of the invention further provide processor control code to implement the above-described systems and methods, for example on a general purpose computer system or on a digital signal processor (DSP). The code is provided on a data carrier such as a disk, CD- or DVD-ROM, or programmed memory such as read-only memory (Firmware). Code (and/or data) to implement embodiments of the invention may comprise source, object or executable code in a conventional programming language (interpreted or compiled) such as C, or assembly code. The above described systems and methods may also be implemented, for example, on an FPGA (field programmable gate array) or in an ASIC (application specific integrated circuit). Thus the code may also comprise code for setting up or controlling an ASIC or FPGA, or code for a hardware description language such as Verilog (Trade Mark), VHDL (Very high speed integrated circuit Hardware Description Language), or RTL code or SystemC. As the skilled person will appreciate such code and/or data may be distributed between a plurality of coupled components in communication with one another.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION

Embodiments relate to systems, methods and computer program code for monitoring and providing feedback on the usage of domestic appliances.

We now describe an example of how to detect and measure specific appliance energy usage, and convert it into other useful metrics, for example an amount (mass or volume) of water, or a temperature of water.

There are many ways to measure the energy-consumption of individual domestic appliances, for example:
1. by use of a "Smart Plug" through which an appliance is plugged to measure the consumption directly, or
2. by measuring the whole-house consumption and then using "Disaggregation" analytics techniques, for example as described in our UK patent application GB1006817.9 filed on 23 Apr. 2010 (incorporated herein by reference for all purposes), to detect the fingerprint of individual devices and thus measure their consumption indirectly.

In some embodiments the operation of a power consuming device is identified from aggregate data, for example from an aggregate power series. An example of this is described in detail later. This information is used to determine the power consumption of the device, and hence to infer information about usage so that user feedback can be given. In other embodiments a Smart Plug is employed to gather data on use of an appliance; a preferred example can be found in our published PCT application WO2009/109787 (incorporated herein by reference for all purposes).

The above methods are capable of measuring not only the total energy consumption of an appliance, but also of extracting detailed data on the precise timing of this consumption, i.e. the second-by-second or minute-by-minute consumption of the appliance.

Figure 1:
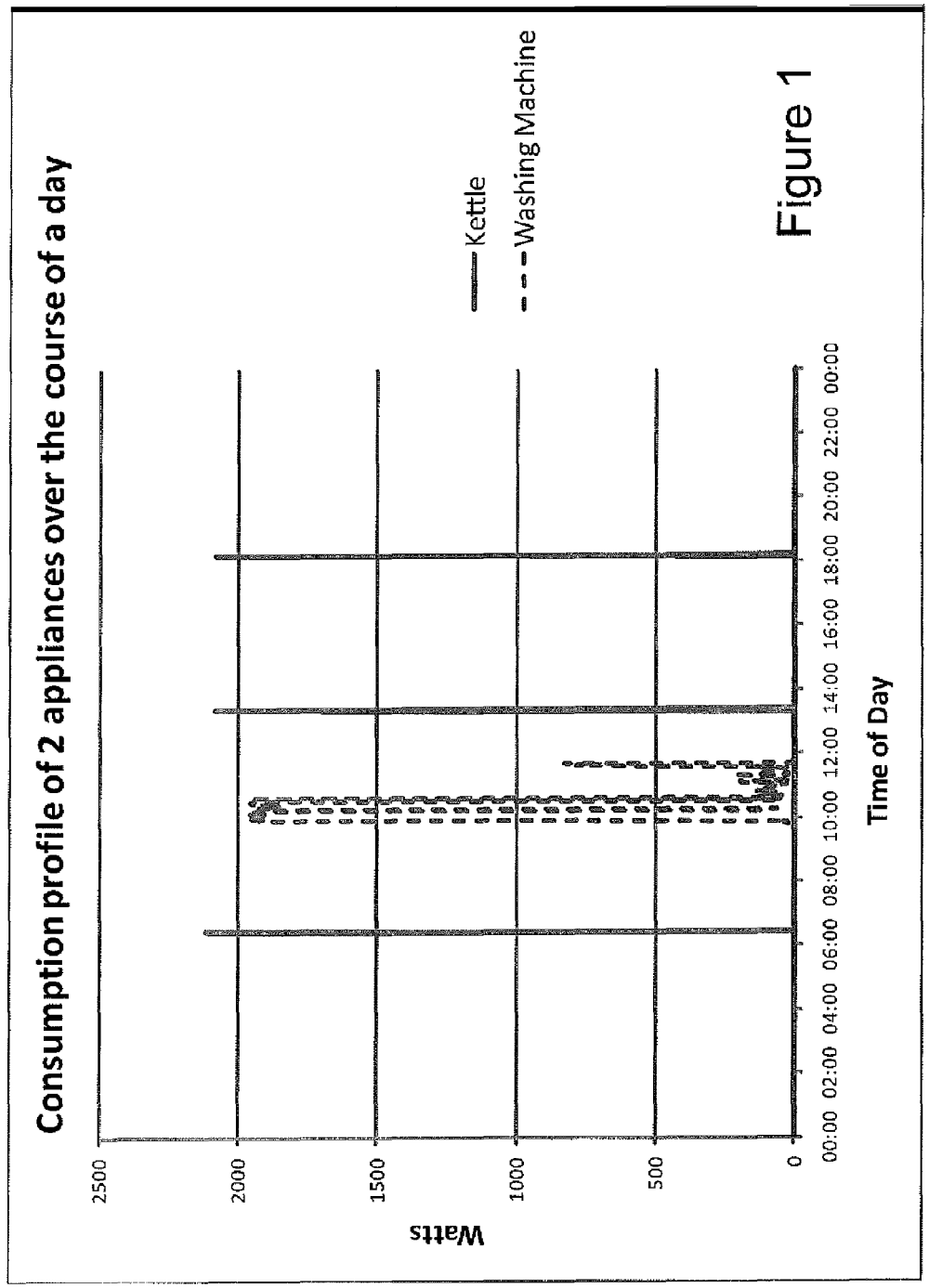
FIG. 1 shows a time-series consumption profile of two appliances.

However, this raw time-series data stream, perhaps expressed in Watts or Watt-hours and displayed in graphical form, as shown in FIG. 1, is of little meaning to the average consumer, because it is not translated into units that they understand (e.g. money), and it provides no actionable information.

Thus an embodiment of the present invention takes as its input:
1) Knowledge of the general type of appliance in question, for example "kettle" or "washing machine". This may be detected automatically, or set manually.
2) Measurement of the total energy expended by the appliance during each use, or during specific parts of its operation.

Figure 2:
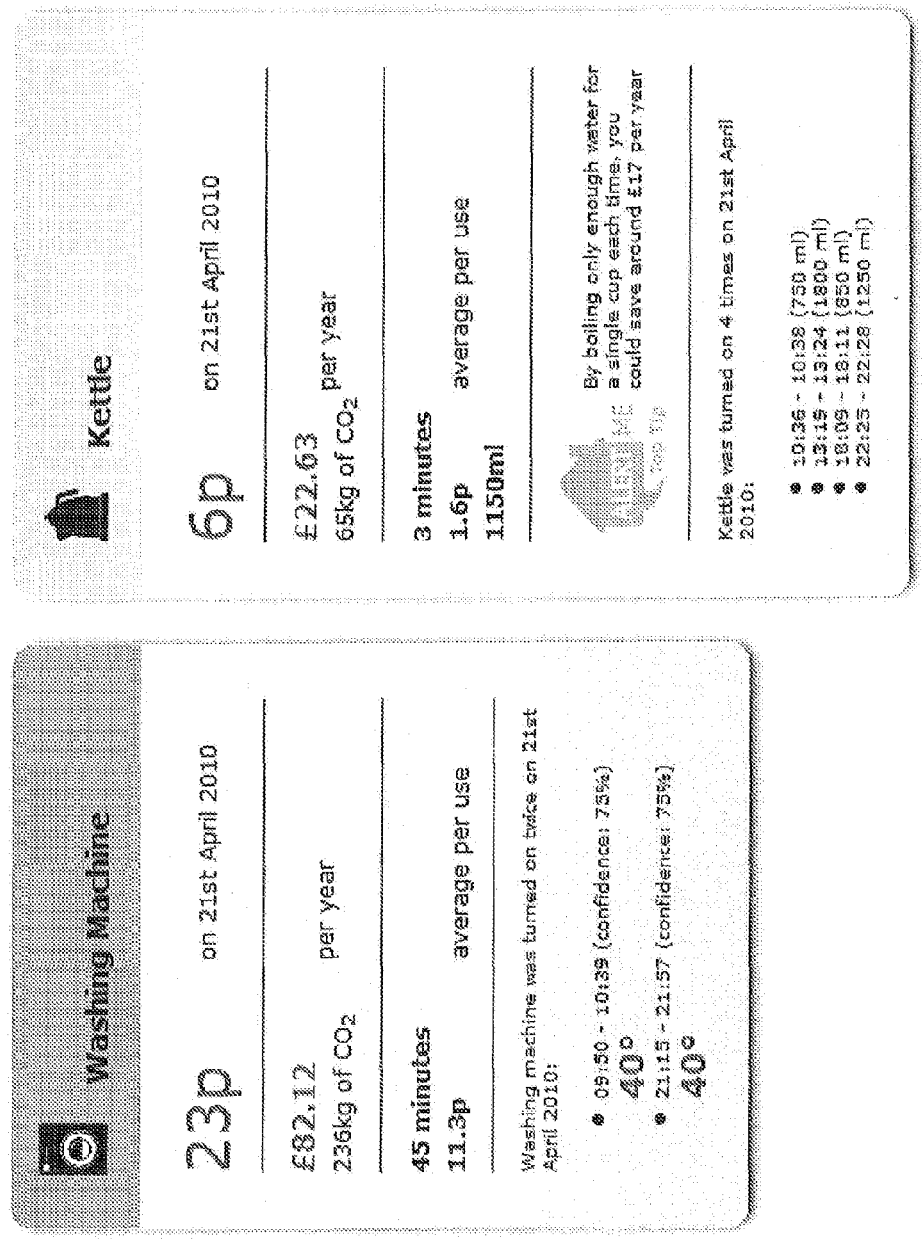
FIG. 2 shows an example of meaningful information delivered as feedback to a consumer.

From these inputs the system derives actionable information of use to the consumer, by use of the specific heat capacity of water, examples of which can be seen in FIG. 2. Thus embodiments of the invention convert energy data into actionable information by use of the specific heat capacity of water.

Specific heat capacity is defined as the energy required to increase the temperature of 1 kilogram of a substance by one degree Kelvin. An example embodiment of the present invention is focused on water-heating, and so we take the following as (roughly) constants:

The specific heat capacity of water

The density of water (relating its mass to its volume)

The starting temperature of water drawn from the mains (about 13° C.)

Given this, if any of the following 2 variables are known, then the 3 is easily calculated:
1) The energy input (power×time)
2) The final temperature (and therefore the temperature rise)
3) The volume of water (and therefore its mass)

For example, if one measures the energy input, and knows the finishing temperature, then the volume of water can be calculated. Or if one measures the energy input, and knows the volume of water, then the finishing temperature can be calculated:

For water at room temperature, the specific heat capacity is:

$Cp = 4.1813$ J/gK

In other words, it takes 4.1813 joules of energy to raise the temperature of 1 g of water by 1 "Kelvin.

Hence, for example, when boiling a kettle, an assumption can be made that the temperature of the water is raised to 100° C. from the current room temperature. The energy consumed can be identified by monitoring the device or by analysis of whole-house energy data.

This information can then be used to determine the amount of water boiled, as illustrated in the following example:

E=energy consumed=360,000 Joules
Δt=increase in temperature=87° K
Cp=specific heat capacity of water=4.1813 J/gK
M=mass of water (in grams)
D=density of water=0.001 liters/gram
V=volume of water (in liters)=MD $$V = \frac{E \cdot D}{Cp \cdot \Delta t} = \frac{0.001 \cdot 360,000}{4.1813 \cdot 87} = 0.99 \text{ liters}$$

Kettle Example

In normal use, a kettle is filled with water from the mains supply at a temperature of typically around 13° C., and once the button is pressed it heats it to boiling point of about 100° C. and then turns off. By knowing that the device in question is a kettle, and by detecting and measuring each one-off use, the present invention can measure the total energy consumption (kWh) of each use, and thereby calculate the total volume of water boiled.

Specific advice can then be given to the consumer that if they boiled less water they could save money—and based on their usage patterns and the amount of water they boil, a specific saving can be estimated, for example "you typically boil 8 cups of water each time you use the kettle. If you boiled only two cups then you would save yourself on average £17/year".

Washing Machine Example

Modern washing-machines typically have only a single water input from the mains supply, and all tend to use a similar load size and therefore volume of water. The first action that the machine takes when started is to heat the water to the chosen temperature. By identifying this heating cycle, and measuring its total consumed energy, the present invention can therefore calculate the approximate final temperature of the water.

Specific advice can then be given to the consumer that if they chose an lower-temperature wash they could save money, for example "You often wash clothes on a 90° C. setting. If you chose to use a 40° C. setting instead, you would save yourself about £40/year".

Example Disaggregation Analytics

We have previously described a method of identifying the operation of a power consuming device from an aggregate power series, the method comprising: receiving an aggregate power series, the aggregate power series comprising aggregate power consumption data for a plurality of power consuming devices; filtering the aggregate power consumption data to separate the aggregate power consumption data into a fast component and a slow component; measuring an average power of the fast component; determining periods during which the measured average power is greater than a first threshold; and comparing the determined period with a model defining operational characteristics of a power consuming device to identify the operation of a power consuming device.

Separating the aggregated power consumption data into a fast component, measuring the average power of the fast component and detecting periods when the average power exceeds a threshold enables the detection and identification of the power consuming device within the low-sample rate aggregated power series. Preferably the step of filtering comprises using a wavelet filter, in particular a Haar wavelet filter. In embodiments measuring an average power comprises measuring a right-tail-10% trimmed root-mean-square of the fast component. The operational characteristics of, say, a washing machine, may comprise one or more of cycle duration, frequency of drum activity and power consumption.

We have also described a method of calculating the power consumption of a power consuming device from an aggregate power series, the aggregate power series comprising aggregate power consumption data for a plurality of power consuming devices, the method comprising: identifying the operation of a power consuming device from a power series according to the present invention and calculating the power consumption using the determined periods during which the measured average power is greater than the threshold, and the measured average power during the determined periods.

An example disaggregation method may be summarized in the following steps:
1. Separate fast (high-frequency) component from the slow (low-frequency) component of the power signal by wavelet-based filter.
2. Robustly measure the average power of the fast component of the power signal by windowed RTMS (root-trimmed-mean-square).
3. Identify isolated bursts of fast-component average power of appropriate duration and level as operation of the power consuming device (for example washing machine drum operation).
4. Compare the measured or processed data against a model of various known characteristics of the power consuming device to identify operation of the power consuming device.

Figure 3:
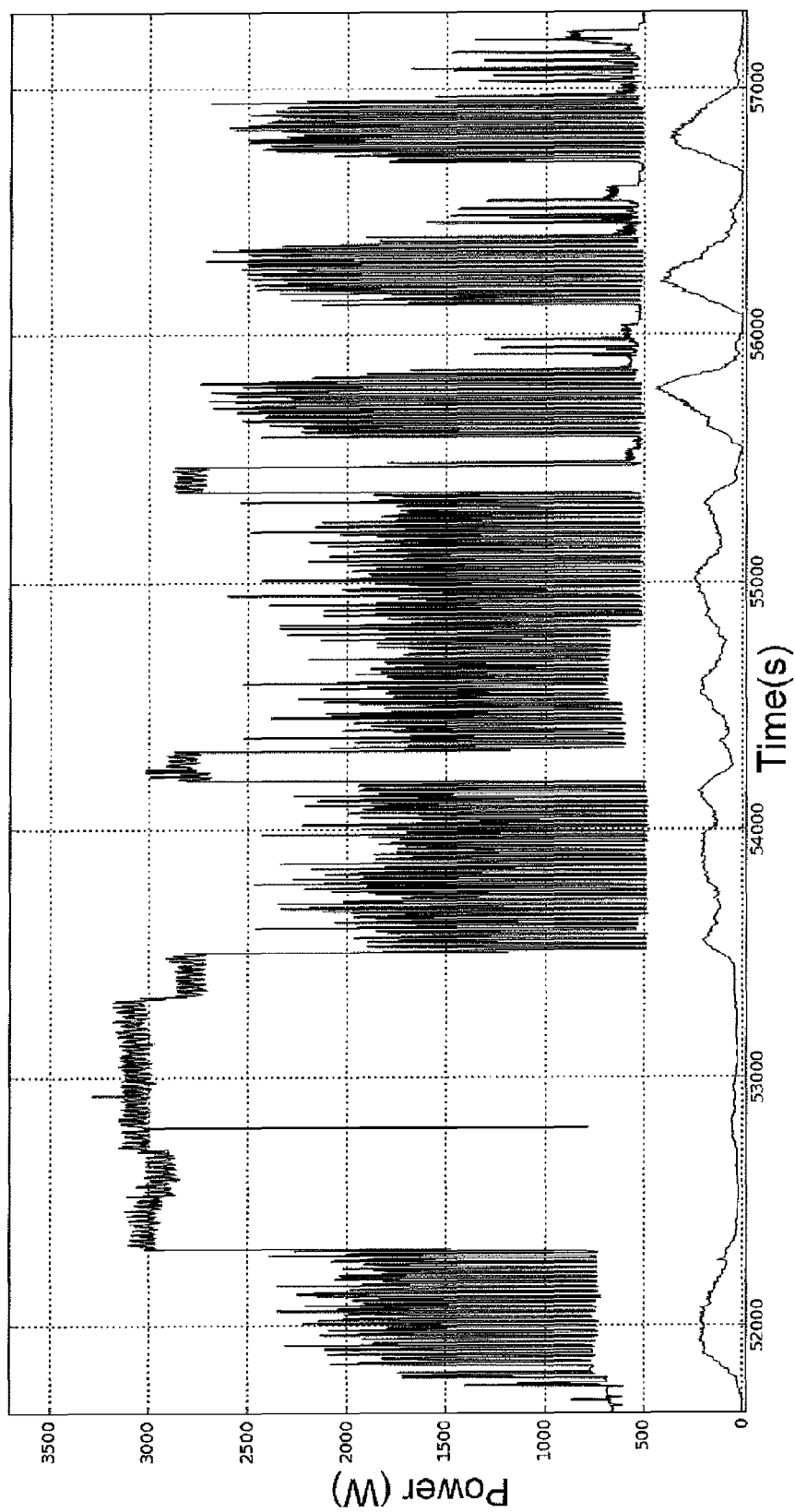
FIG. 3 shows an aggregated power series.

FIG. 3 shows an aggregated power series for a property over a period of approximately 5000 seconds, during which various power consuming devices are switched were in operation (in this example, the power consuming device under investigation is a washing machine). The data is sampled at approximately 1 Hz. Identifying specific times of operation of power consuming devices, such as a washing machine, and determining useful parameters such as power consumption of such a device directly from this raw data would be difficult.

Figure 4:
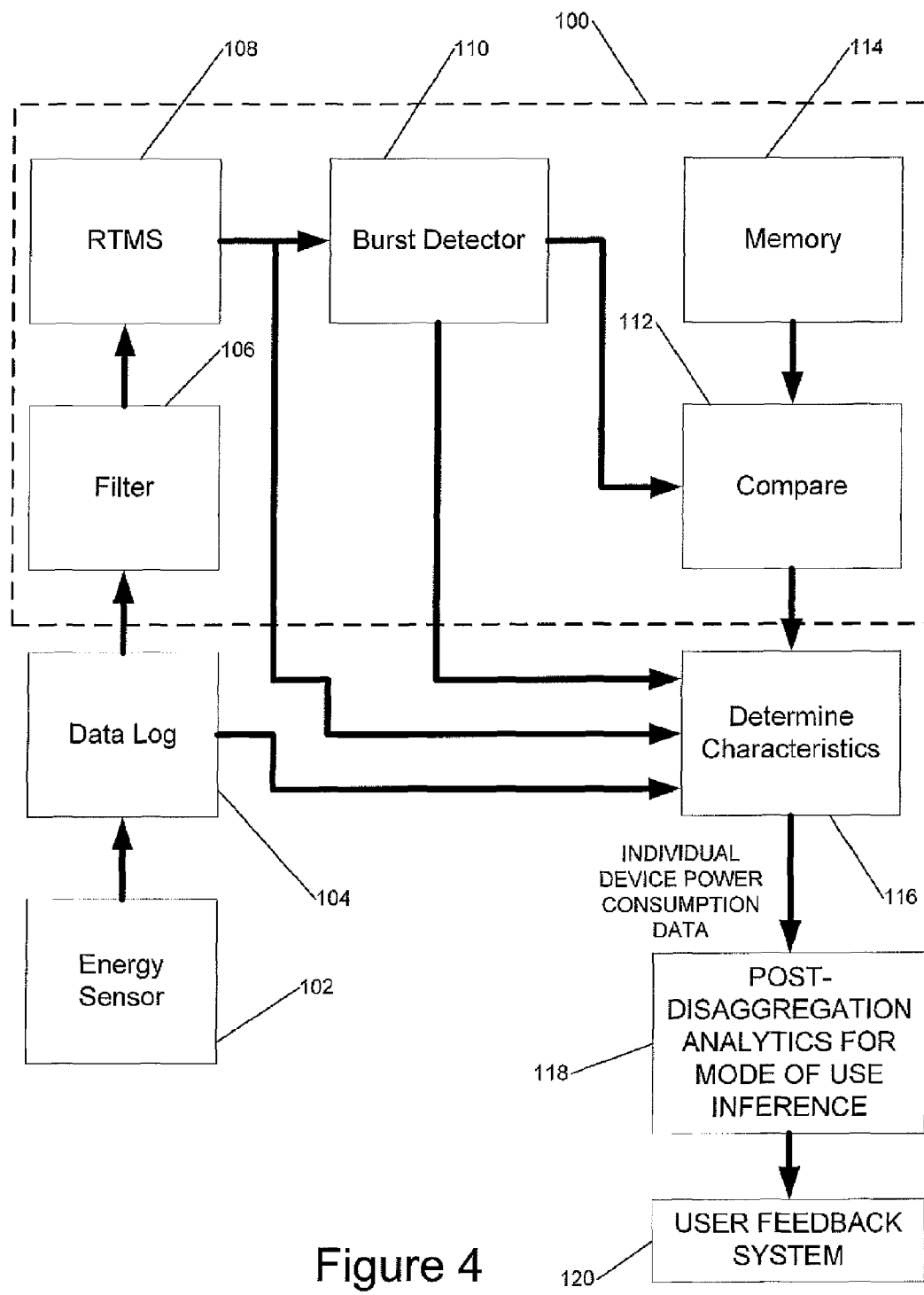
FIG. 4 shows a method and system according to an embodiment of the present invention.

FIG. 4 shows a system for identifying the operation of a power consuming device (for example a washing machine) from an aggregate power series, and for analyzing this data to provide user feedback. A data log 104 receives and stores aggregate power series data from an energy sensor 102. The sensor 102 may be a non-invasive sensor, for example a sensor inductively coupled to one of the phase supplies for the property of interest. It is assumed that the energy sensor provides real or apparent power data. (In other embodiments a current sensor may be employed, for example assuming or measuring a mains voltage). The system 100 receives the stored aggregate power series data from the data log 104. The aggregate power series data comprises electrical power consumption data for a number of power consuming devices in the property of interest.

The system 100 filters the aggregate power consumption data to separate the data into 'fast' and 'slow' components. For example, the filter is a wavelet filter (e.g. a Haar wavelet filter). The terms 'fast' and 'slow' components are used to identify power components of the data that change relatively faster or slower compared to the sample rate of the data. For example, the heating element of a washing machine could be on for a period of several minutes during a full washing cycle. This would be considered a slow component. On the other hand, operation of the motor to drive the washing machine drum (on for several seconds, off for several seconds, on for several seconds and so on) would be considered a fast component.

Although in the wavelet domain one cannot directly talk about cut-off frequencies, there is a relationship between the level of decomposition and frequency. The equivalent harmonic cut-off frequency of the preferred wavelet filter used in the present invention is 0.125 Hz, which corresponds to the harmonic period of 8 seconds. As such, and for the avoidance of doubt, a component having an on-off period of less than 8 seconds will be considered a fast component. Anything above 8 seconds will be considered a slow component. The skilled person will understand that other values may be used. A wavelet filter is the preferred filter, as it localizes well in time and frequency. The signal is non-stationary, nor linear, so linear filters are not appropriate for this task. However, other time-frequency methods may be used, for example short Fourier Transforms.

Once separated into fast and slow components by the wavelet filter 106, the fast component data is passed to a module 108 for measuring the average power of the fast component. Preferably, this is carried out using a right-tail-10%-trimmed mean square algorithm (RTMS) i.e. an asymmetric trimmed mean. In such an algorithm, the 10% of highest values (the right tail) are discarded; the smallest values (left tail) are left untouched (compared to other 10% trimmed mean square algorithms, in which the upper and lower 10% of values are discarded). This provides a statistically more accurate measure of the average power without other components (for example a kettle operated during the washing cycle) skewing the results. Devices such as kettles produce spikes in the high-frequency channel, as they generate high frequency, high amplitude content, which would bias an estimate for the washing machine if the values were just averaged. The right-tail-10%-trimmed-mean-square algorithm provides a statistical filtering function.

Figure 5:
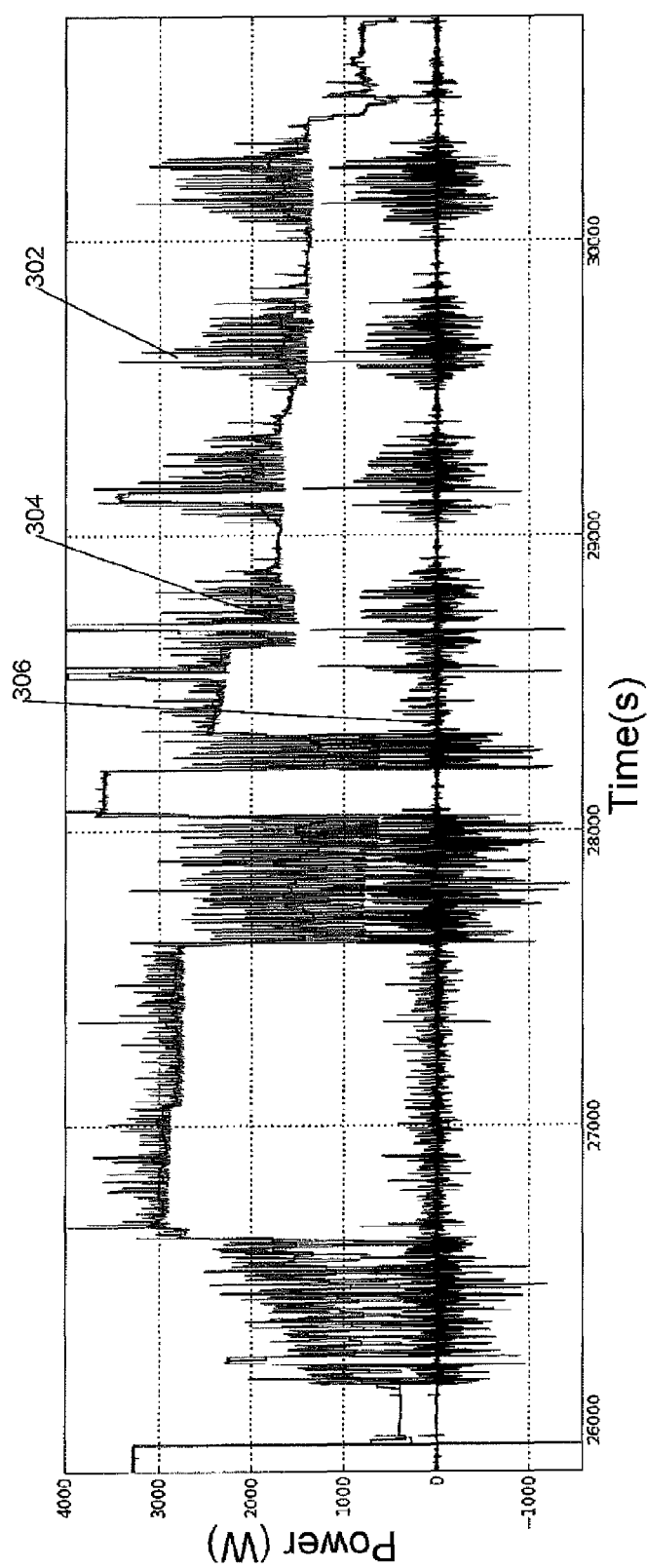
FIG. 5 shows the separated fast and slow components from an aggregated power series.

FIG. 5 shows the separated fast and slow components from an aggregated power series. The line 302 is the aggregate power series. Within that line can be seen the slow component 304. The lowest line 306 shows the fast component. Once converted into an RTMS value, the measured power data is passed to a burst detector 110, which compares the RTMS value against a threshold RTMS power value. The threshold is set at a value that corresponds to known operation of the washing machine. Any RTMS value above the threshold is considered a valid value, and therefore an indication that the washing machine is in operation. For example, the threshold may be set at 25.

Bursts of activity detected by the burst detector correspond to periods when the washing machine's drum is turning. During operation, the drum may turn several times, stop for several seconds, turn several times in the other directions, stop for several seconds and so on. Typically the duration of such "burst" is from 4 minutes (later in the program as seen in the figure) to an hour (the initial washing cycle is quite long). Again this varies with the program, make, model etc.

Figure 6:
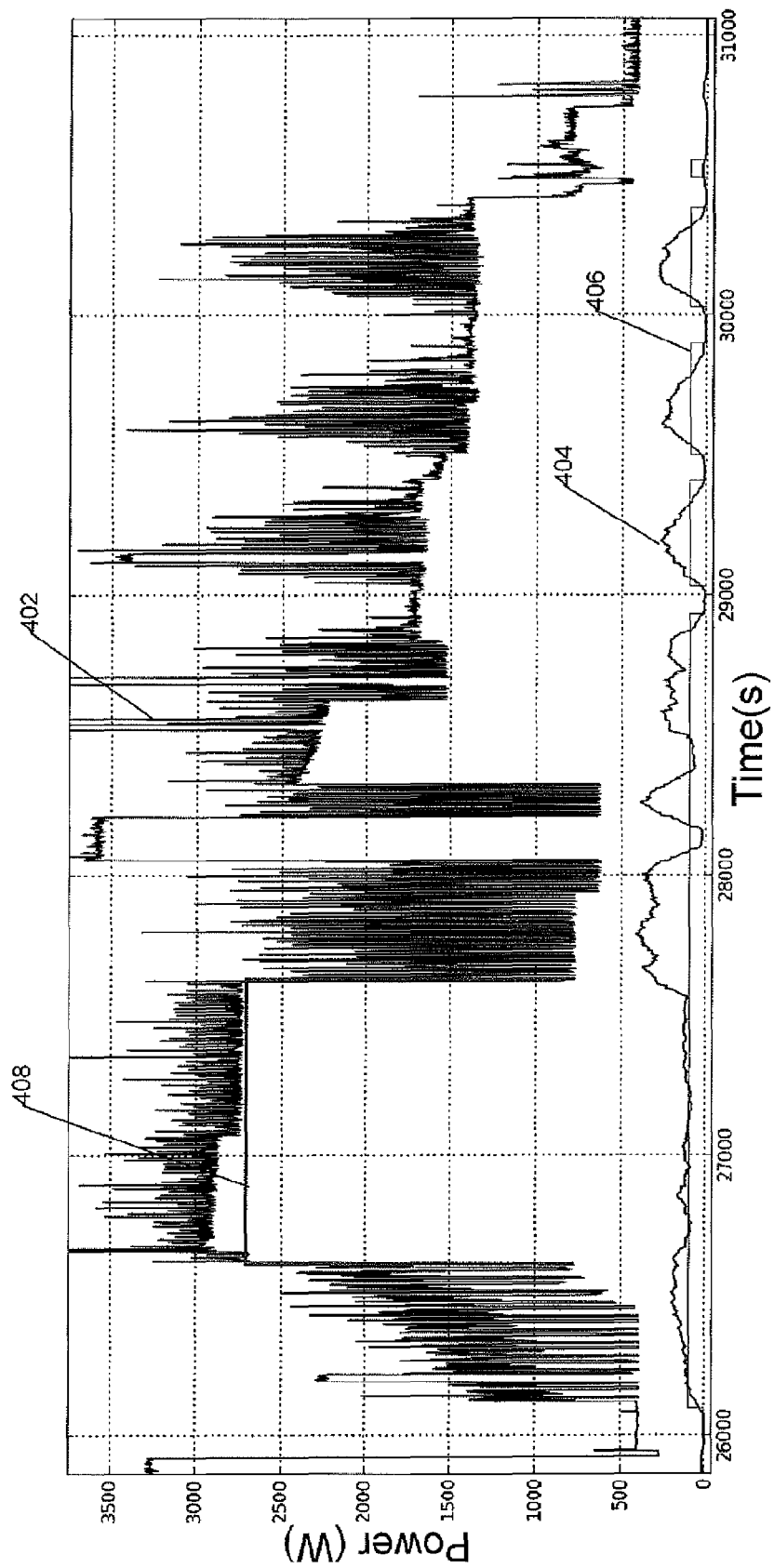
FIG. 6 shows the RTMS value and burst analysis of an aggregated power series.

FIG. 6 shows the RTMS value and burst analysis of an aggregated power series. The upper line is the aggregate power series data 402. Line 404 is the RTMS value taken from the fast component of the aggregate power series. Line 406 is the output of the burst detector. Line 408 denotes a period when the heating element of the washing machine is in operation. The burst detector 110 therefore provides a signal that is dependent on the operation of the washing machine, and therefore provides an indication of when the washing machine is in operation. The washing machine can then be identified by comparing the measured or processed data (i.e. the raw data from the data log, the output of the RTMS module or the output of the burst detector) against a model of various known characteristics of the washing machine (for example stored in a memory 114).

Once the operational window of the washing machine has been detected, all manner of characteristics of the washing machine may be obtained 116. For example, the on and off time may be determined, which gives a measure of the duration of the whole cycle. A total power consumption value may be calculated from the on periods and the RTMS value for those on periods, and the associated cost may be calculated from the above and known energy consumption values.

Furthermore, once the power consumption signature of the washing machine has been identified from the above method, this data can be compared with previously-stored power consumption cycles of the washing machine. Any substantial differences between the latest data and previously-stored data could indicate a change in user habits, and the user can therefore be alerted.

In embodiments the system infers a mode of use of the appliance 118, for example a water volume and/or temperature, from the determined device power consumption characteristics, and then provides user feedback 120. The feedback may take many forms including one or more of: graphical, textual, verbal, visual, feedback to a mobile device such as a mobile phone, feedback via a web interface, and the like.

It will be understood that it is not always possible to reliably put embodiments of the present invention into practice, for example because sometimes a kettle may be re-boiled, or an appliance may be mis-identified or missed altogether. However the value of a system according to an embodiment of the invention can be considerable even if it only works occasionally, as it is still possible to provide consumers with a reliable estimate of potential savings based on typical use patterns, without having to precisely capture or measure every single use.

It will be apparent to the skilled reader that power consumption feedback techniques described above are also applicable to many different types of domestic power consuming devices including, but not limited to, dishwashers, tumble driers, irons, ovens, kettles and the like.

No doubt many other effective alternatives will occur to the skilled person. It will be understood that the invention is not limited to the described embodiments and encompasses modifications apparent to those skilled in the art lying within the scope of the claims appended hereto.

What is claimed is:

1. A system to provide feedback to a user of an appliance for energy saving, the system comprising a processor and code disposed in memory for execution by the processor, the code configured, when executed, for:
   monitoring an energy consumption of the appliance;
   inferring a mode of use of the appliance from said power consumption wherein said inferred mode of use comprises one of: an inferred amount of water heated by said appliance, and a temperature to which water is heated by said appliance; and
   providing feedback to said user responsive to said inferred mode of use to indicate how an amount of energy used by said appliance may be reduced.

2. A system as claimed in claim 1, wherein said code for monitoring said power consumption is configured for identifying one or more periods of operation of said appliance from data representing aggregate power consumption of a plurality of devices including said appliance.

3. A system as claimed in claim 2, comprising an energy sensor for monitoring mains electricity power consumption of said plurality of devices.

4. A system as claimed in claim 1, comprising a plug-through power sensing device for monitoring said power consumption.

5. A system as claimed in claim 1, wherein said feedback comprises one or both of an estimated energy saving and an estimated cost saving by reducing one or both of an amount of water use and a temperature to which water is heated by said appliance.

6. A method of providing feedback to a user of an appliance for energy saving, the method comprising:
   monitoring an energy consumption of the appliance;
   inferring a mode of use of the appliance from said power consumption, wherein said inferred mode of use comprises one of: an inferred amount of water heated by said appliance, and a temperature to which water is heated by said appliance; and
   providing feedback to said user responsive to said inferred mode of use to indicate how an amount of energy used by said appliance may be reduced.

7. A method as claimed in claim 6, wherein said feedback comprises one or both of an estimated energy saving and an estimated cost saving by reducing one or both of an amount of water use and a temperature to which water is heated by said appliance.

8. A method as claimed in claim 6, wherein one or more elements of the method are performed by a microprocessor executing a computer program code.

9. A method of identifying the operation of a power consuming device from an aggregate power series, the method comprising:
   receiving an aggregate power series, the aggregate power series comprising aggregate power consumption data for a plurality of power consuming devices;

filtering the aggregate power consumption data to separate the aggregate power consumption data into a fast component and a slow component;

measuring an average power of the fast component;

determining periods during which the measured average power is greater than a first threshold; and comparing at least one of the determined periods with a model defining operational characteristics of a power consuming device to identify the operation of a power consuming device.

10. A method according to claim 9, wherein filtering comprises using a wavelet filter.

11. A method according to claim 10, wherein the wavelet filter is a Haar wavelet filter.

12. A method according to claim 9, wherein measuring an average power comprises measuring a right-tail-10% trimmed root-mean-square of the fast component.

13. A method according to claim 9, wherein the operational characteristics of the module comprise one or more of cycle duration, frequency of drum activity and power consumption.

14. A method according to claim 9, wherein the method is further operable to calculate the power consumption of the power consuming device from the aggregate power series, the method further comprising:

calculating the power consumption using the determined periods during which the measured average power is greater than the threshold, and the measured average power during the determined periods.

15. A method according to claim 9, wherein the method is further operable to detect a fault in the operation of the power consuming device from the aggregate power series, the method comprising:

comparing the measured average power and/or determined periods with a model of a known operation of the power consuming device to identify differences indicative of a fault in the operation of the power consuming device.

16. A method according to claim 9, wherein the power consuming device comprises one or more of a washing machine, dishwasher, tumble drier, iron and electrical oven.

17. A system for identifying the operation of a power consuming device from an aggregate power series, the system comprising a processor and code in memory for execution by the processor, the code configured, when executed, to:

receive an aggregate power series, the aggregate power series comprising aggregate power consumption data for a plurality of power consuming devices;

filter the aggregate power consumption data to separate the aggregate power consumption data into a fast component and a slow component;

measure an average power of the fast component;

determine periods during which the measured average power is greater than a first threshold; and compare at least one determined period with a model defining operational characteristics of a power consuming device to identify the operation of the power consuming device.

* * * * *